(12) United States Patent
Noguchi et al.

(10) Patent No.: US 11,895,793 B2
(45) Date of Patent: Feb. 6, 2024

(54) IMAGE PICKUP UNIT AND IMAGING APPARATUS

(71) Applicant: CANON KABUSHIKI KAISHA, Tokyo (JP)

(72) Inventors: Koji Noguchi, Tokyo (JP); Yuya Okada, Kanagawa (JP); Mitsutoshi Hasegawa, Kanagawa (JP)

(73) Assignee: CANON KABU SHIKI KAISHA, Tokyo (JP)

( * ) Notice: Subject to any disclaimer, the term of this patent is extended or adjusted under 35 U.S.C. 154(b) by 291 days.

(21) Appl. No.: 17/220,606

(22) Filed: Apr. 1, 2021

(65) Prior Publication Data
US 2021/0320142 A1    Oct. 14, 2021

(30) Foreign Application Priority Data

Apr. 9, 2020 (JP) .................................. 2020-070655
Mar. 3, 2021 (JP) .................................. 2021-033766

(51) Int. Cl.
*H05K 5/02* (2006.01)
*H05K 1/14* (2006.01)
*H01K 1/14* (2006.01)

(52) U.S. Cl.
CPC ............. *H05K 5/0247* (2013.01); *H05K 1/14* (2013.01); *H05K 1/147* (2013.01); *H05K 1/148* (2013.01); *H01K 1/14* (2013.01)

(58) Field of Classification Search
CPC .................................................... H05K 3/363
See application file for complete search history.

(56) References Cited

U.S. PATENT DOCUMENTS

| | | | | |
|---|---|---|---|---|
| 7,122,787 B2* | 10/2006 | Nishizawa | .............. | H01L 27/14 348/374 |
| 7,558,473 B2* | 7/2009 | Shin | ....................... | H04N 23/68 348/208.7 |

(Continued)

FOREIGN PATENT DOCUMENTS

| | | |
|---|---|---|
| CN | 1904669 A | 1/2007 |
| JP | 2009-295821 | 12/2009 |

(Continued)

OTHER PUBLICATIONS

WO 2018203481 A1 English translation (Year: 2018).*

(Continued)

*Primary Examiner* — Mukundbhai G Patel
(74) *Attorney, Agent, or Firm* — VENABLE LLP

(57) ABSTRACT

An image pickup unit includes: a printed wiring board provided with an image pickup element and having a first electrode on a surface layer; a flexible wiring substrate having a base member having first and second faces, a conductive layer provided on the first face, and an insulating layer provided on the conductive layer, wherein the conductive layer has a second electrode in which the insulating layer is not provided to one longitudinal end part; a conductive connection member that connects the first electrode to the second electrode; and a reinforcement member provided on the base member on the second face side, wherein the reinforcement member continuously covers an end part of the insulating layer on a side closer to the second electrode and an end part of the conductive connection member on a side closer to the insulating layer of a portion connected to the second electrode.

20 Claims, 17 Drawing Sheets

(56) References Cited

U.S. PATENT DOCUMENTS

| | | | |
|---|---|---|---|
| 10,582,615 B2 | 3/2020 | Noguchi | |
| 10,897,820 B2 | 1/2021 | Noguchi | |
| 2016/0374200 A1* | 12/2016 | Lee | H05K 1/118 |
| 2020/0113056 A1 | 4/2020 | Hasagawa | |
| 2020/0236261 A1 | 7/2020 | Okada | |

FOREIGN PATENT DOCUMENTS

| | | | |
|---|---|---|---|
| JP | 2009-295821 A | 12/2009 | |
| WO | WO 2018203481 | * 11/2018 | H05K 3/363 |

OTHER PUBLICATIONS

U.S. Appl. No. 17/370,982, filed Jul. 8, 2021 by Mitsutoshi Hasegawa et al.

Chinese Office Action dated Sep. 27, 2023 during prosecution of related Japanese application No. 2021-10361388.8 (English-language machine translation not included.).

* cited by examiner

IMAGE PICKUP UNIT AND IMAGING APPARATUS

BACKGROUND OF THE INVENTION

Field of the Invention

The present invention relates to an image pickup unit and an imaging apparatus.

Description of the Related Art

Japanese Patent Application Laid-Open No. 2009-295821 proposes the structure of composite substrates having connection structure between substrates. The composite substrate disclosed in Japanese Patent Application Laid-Open No. 2009-295821 has a first flexible wiring board on which a reinforcement plate is stacked on the first face and a second flexible wiring board joined to the second face of the first flexible wiring board. Further, the reinforcement plate has a portion protruding beyond the end face of the first flexible wiring board so as to overlap the joint portion between the first and second flexible wiring boards. Japanese Patent Application Laid-Open No. 2009-295821 discloses that wiring patterns of the first and second flexible wiring boards are electrically connected to each other at the joint portion, the reinforcement plate and the second flexible wiring board are fixed to each other by an adhesive agent, and this prevents a wire in a portion of exposed wiring patterns from being disconnected due to a bending stress.

However, when flexible wiring substrates are connected to a moving component that moves finely, such as an image stabilizing unit, for example, the rigidity of the entire system is increased in the technology disclosed in Japanese Patent Application Laid-Open No. 2009-295821, and therefore flexibility of the flexible wiring substrate is lost. As a result, driving of the moving component is suppressed in the technology disclosed in Japanese Patent Application Laid-Open No. 2009-295821.

SUMMARY OF THE INVENTION

According to one aspect of the present invention, provided is an image pickup unit includes: a printed wiring board provided with an image pickup element and having a first electrode on a surface layer; a flexible wiring substrate having a base member having a first face and a second face, a conductive layer provided on the first face, and an insulating layer provided on the conductive layer, wherein the conductive layer further has a second electrode in which the insulating layer is not provided to one longitudinal end part; a conductive connection member that connects the first electrode to the second electrode; and a reinforcement member provided on the base member on the second face side, wherein the reinforcement member continuously covers an end part of the insulating layer on a side closer to the second electrode and an end part of the conductive connection member on a side closer to the insulating layer of a portion connected to the second electrode.

According to another aspect of the present invention, provided is an imaging apparatus having a casing and an image pickup unit inside the casing, and the image pickup unit is the image pickup unit described above.

Further features of the present invention will become apparent from the following description of exemplary embodiments with reference to the attached drawings.

DESCRIPTION OF THE EMBODIMENTS

Figure 1:
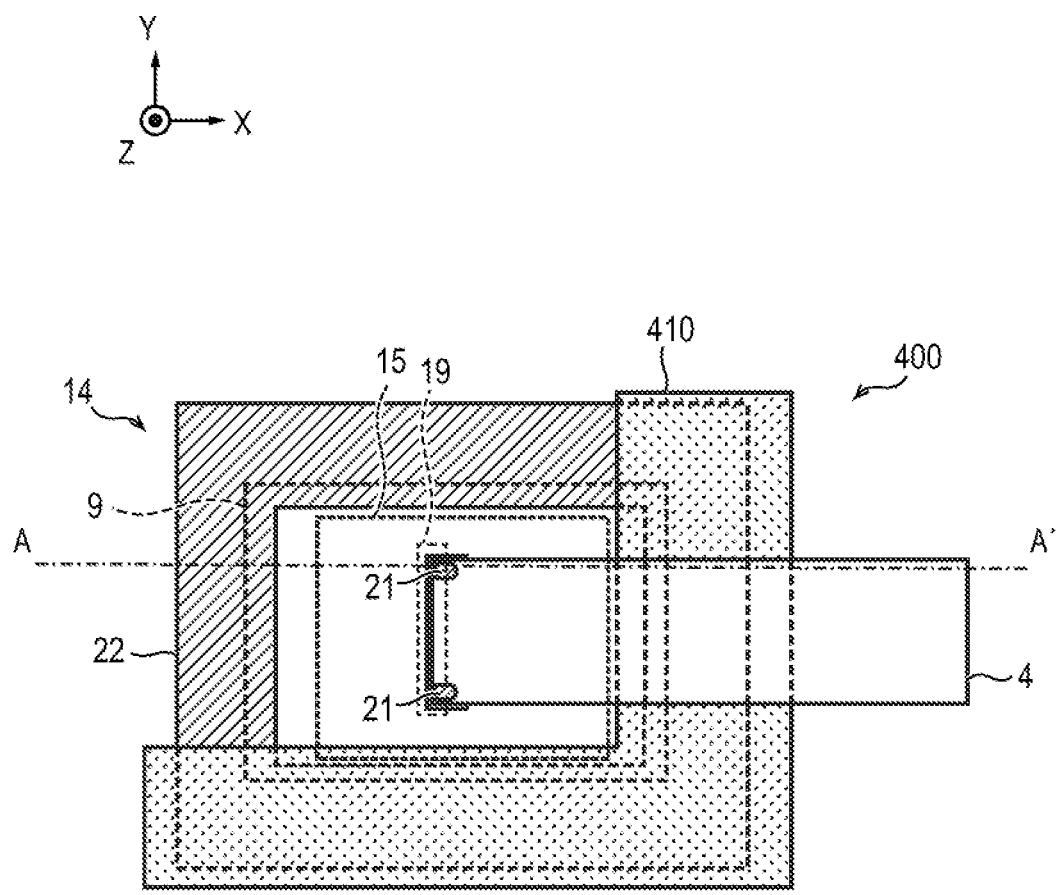
FIG. 1 is a top view illustrating a general configuration of an image pickup unit according to a first embodiment.

Embodiments of the present invention will be described below in detail with reference to the drawings. Note that the present invention is not limited to the embodiments described below and can be changed as appropriate within the scope not departing from the spirit of the present invention. Further, in the drawings illustrated below, components having the same function are labeled with the same references, and the description thereof may be omitted or simplified.

First Embodiment

An image pickup unit according to a first embodiment will be described with reference to FIG. 1, FIG. 2 and FIG.

3. FIG. 1 is a schematic top view illustrating a general configuration of an image pickup unit 400 according to the present embodiment. FIG. 2 is a schematic sectional view illustrating a general configuration of the image pickup unit 400 according to the present embodiment and illustrates a cross section taken along a line A-A' of FIG. 1.

Figure 2:
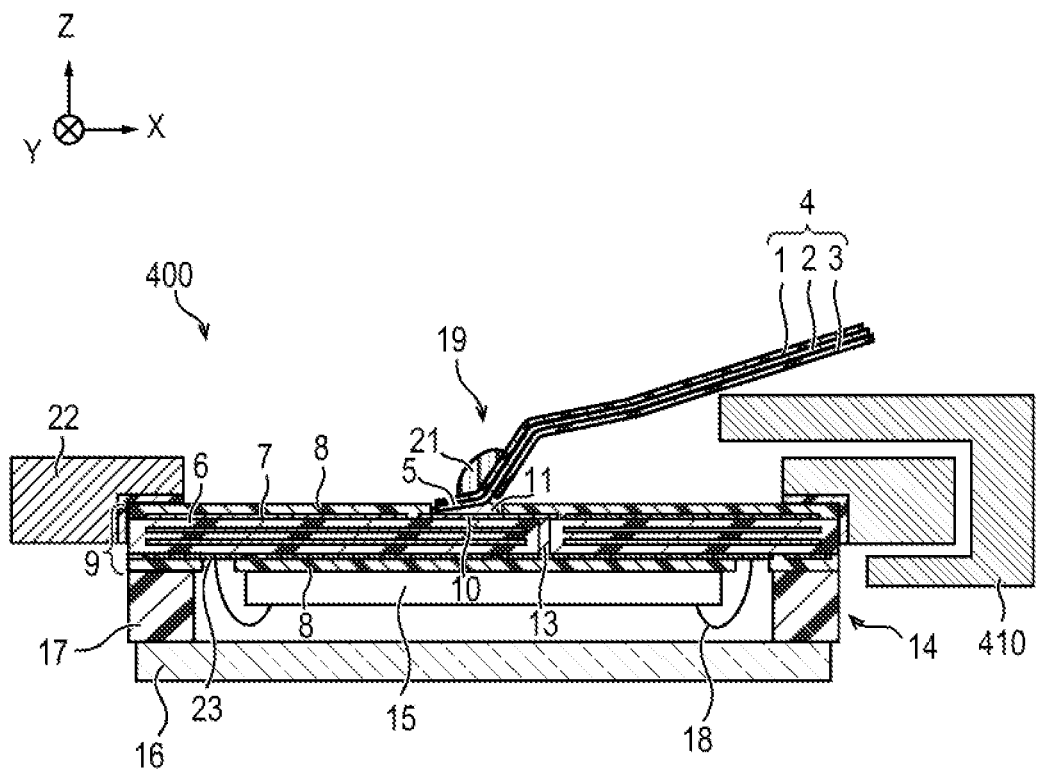
FIG. 2 is a schematic sectional view illustrating a general configuration of the image pickup unit according to the first embodiment.
Figure 3:
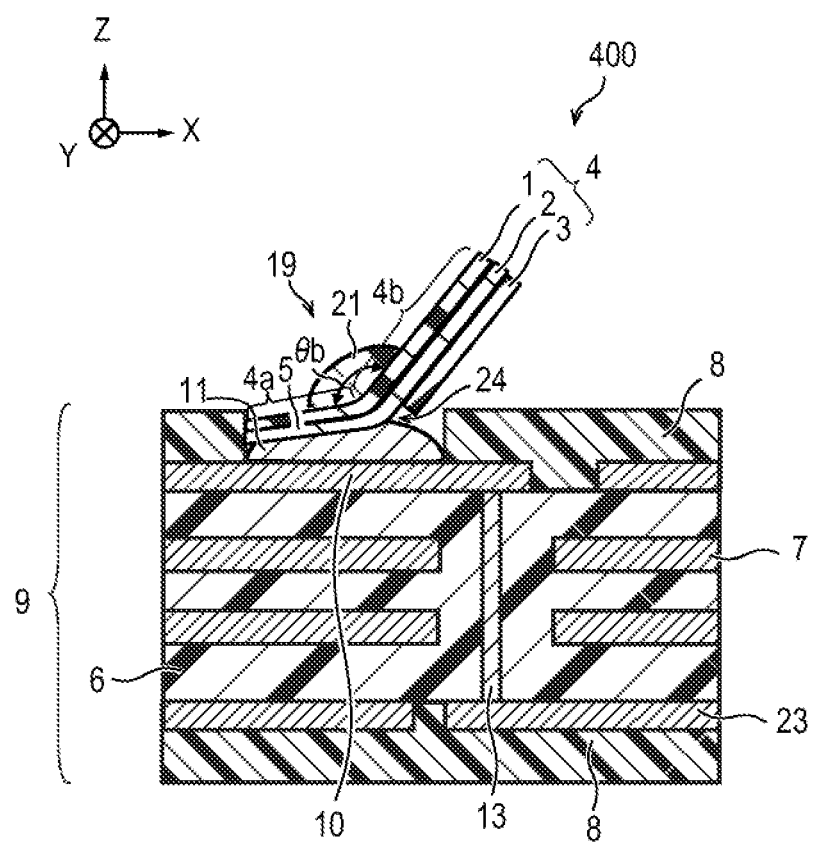
FIG. 3 is an enlarged schematic sectional view illustrating a connection portion between a flexible wiring substrate and a printed wiring board of the image pickup unit according to the first embodiment.

FIG. 3 is an enlarged schematic sectional view illustrating a connection portion 19 between a flexible wiring substrate 4 and a printed wiring board 9 of the image pickup unit 400 according to the present embodiment and enlarges and illustrates a cross section of the connection portion 19 in FIG. 2.

As illustrated in FIG. 1, FIG. 2, and FIG. 3, the image pickup unit 400 has an imaging sensor module 14 having a printed wiring board 9, an image stabilizing unit 410, and the flexible wiring substrate 4. The flexible wiring substrate 4 is connected to the printed wiring board 9 via solder 11 in the connection portion 19 as described later.

Herein, respective coordinate axes such as an X-axis, a Y-axis, and a Z-axis and directions in an XYZ coordinate system that is an orthogonal coordinate system and directions thereof used for the following description will be defined. First, an axis perpendicular to the primary face of the printed wiring board 9 is defined as the Z-axis. Further, an axis that is parallel to the primary face of the printed wiring board 9 and is along a pair of edge sides of the printed wiring board 9 that are parallel to each other is defined as the X-axis. Furthermore, an axis perpendicular to the X-axis and the Z-axis is defined as the Y-axis. In the XYZ coordinate system where coordinate axes are defined as described above, directions along the X-axis are defined as X directions, and out of the X directions, a direction from one end of the flexible wiring substrate 4 on the connection portion 19 side to the other end is defined as a +X direction, and a direction opposite to the +X direction is defined as a −X direction. Further, directions along the Y-axis are defined as Y directions, and out of the Y directions, a direction from the right side to the left side with respect to the +X direction is defined as a +Y direction, and a direction opposite to the +Y direction is defined as a −Y direction. Further, directions along the Z-axis are defined as Z directions, and out of the Z directions, a direction from an imaging sensor element 15 of the imaging sensor module 14 to the connection portion 19 side is defined as a +Z direction, and a direction opposite to the +Z direction is defined as a −Z direction. Furthermore, a rotation direction around the Z-axis is defined as a θ direction.

The flexible wiring substrate 4 has a flexible base member 1, a flexible wiring layer 2, and a cover lay 3. The flexible wiring substrate 4 has one or more conductive layers as the flexible wiring layer 2 and is configured such that the conductive layers are stacked as insulating layers via the flexible base member 1. Note that, in the present embodiment, while the case where the wiring layer in the flexible wiring substrate 4 is of a single layer is described, the wiring layer may be of multiple layers without being limited to a single layer.

The flexible base member 1 is a sheet-like or film-like insulating base member formed of a resin or the like, for example, and has plasticity and flexibility. Thus, the flexible wiring substrate 4 is deformable such as being bendable. The insulator forming the flexible base member 1 may have electrical insulation. As an insulator forming the flexible base member 1, polyimide, polyethylene terephthalate, or the like may be used, for example. The flexible base member 1 has a front surface that is a first face and a back surface that is a second face. On the front surface and the back surface of the flexible base member 1, layers or members are provided as described below.

The flexible wiring layer 2 is a conductive layer formed of a copper foil, other metallic foils, or the like. The flexible wiring layer 2 has a wiring pattern. The flexible wiring layer 2 is formed on one side or both sides of the front surface and the back surface of the flexible base member 1. The flexible wiring layer 2 may be directly formed on the front surface or the back surface of the flexible base member 1 or may be formed over the front surface or the back surface of the flexible base member 1 via a layer structure such as an insulating layer. A conductor forming the flexible wiring layer 2 is a material having higher conductivity and higher thermal conductivity than the insulator and may be, for example, a metal such as Cu, Ag, and Au. Note that the flexible wiring layer 2 only needs to be formed on at least one side of the flexible base member 1. For example, the flexible wiring layer 2 is provided on the front surface of the flexible base member 1 facing the printed wiring board 9 side.

The cover lay 3 is an insulating layer that protects the wiring pattern of the flexible wiring layer 2. The cover lay 3 is formed of a cover film, an overcoat, or the like. The cover lay 3 is provided on the surface layer of the flexible wiring substrate 4 and is formed so as to cover the flexible wiring layer 2 on the surface including the flexible wiring layer 2 of the flexible base member 1. For example, the cover lay 3 is provided on the flexible wiring layer 2 provided on the front surface of the flexible base member 1.

On the side of the cover lay 3 provided on the front surface of the flexible base member 1 of the flexible wiring substrate 4, the cover lay 3 is not formed at one longitudinal end part of the flexible wiring substrate 4, and the flexible wiring layer 2 is exposed. The exposed portion of the flexible wiring layer 2 forms a first electrode 5. That is, the flexible wiring layer 2 provided on the front surface of the flexible base member 1 has the first electrode 5 in which the cover lay 3 is not provided at one longitudinal end part. Further, on the first electrode 5, Au or the like may be plated. A plurality of first electrodes 5 formed of the exposed flexible wiring layer 2 are aligned at a predetermined pitch, for example. In such a way, the first electrode 5 is formed of the flexible wiring layer 2 exposed in the longitudinal end part of the flexible wiring substrate 4. One longitudinal end part on which the first electrode 5 of the flexible wiring substrate 4 is formed forms an electrode portion on which the first electrode 5 is exposed. Note that, although not illustrated, the other longitudinal end part of the flexible wiring substrate 4 is formed of an insertion terminal in which an electrode is formed.

In the connection portion 19 between the printed wiring board 9 of the imaging sensor module 14 and the flexible wiring substrate 4, the first electrode 5 exposed to one longitudinal end part of the flexible wiring substrate 4 is connected to a second electrode 10 of the printed wiring board 9 via the solder 11. Note that a gap is formed between the cover lay 3 of the flexible wiring substrate 4 connected to the printed wiring board 9 at the connection portion 19 and the solder 11, and it is desirable that an exposed portion 24 in which the flexible wiring layer 2 is exposed be ensured. That is, it is desirable that the flexible wiring layer 2 be exposed between the end part of the solder 11 on the cover lay 3 side and the end part of the cover lay 3 on the solder 11 side. The exposed portion 24 is a portion in which the first electrode 5 is exposed between the end part of the cover lay 3 on the side closer to the first electrode 5 and the solder 11.

When the exposed portion 24 is ensured, the end part of the cover lay 3 on the side closer to the first electrode 5 and the solder 11 are not in contact with each other. By ensuring the exposed portion 24, it is possible to reinforce the connection portion 19 between the flexible wiring substrate 4 and the printed wiring board 9 by using the reinforcement member 21 while reducing a decrease in flexibility of the flexible wiring substrate 4 due to a reinforcement member 21 described later to be smaller.

Although illustration is omitted, an insertion terminal at the other longitudinal end part of the flexible wiring substrate 4 is inserted into a connector mounted on a printed wiring board of an image processing unit. In such a way, the flexible wiring substrate 4 electrically connects the image pickup unit 400 and the image processing unit to each other.

The imaging sensor module 14 has the printed wiring board 9, an imaging sensor element 15, a frame 17, and a cover glass 16. The printed wiring board 9 is adhered and fixed to a metal frame 22 by using an adhesive agent such as an ultraviolet curable resin. The imaging sensor module 14 is supported by the image stabilizing unit 410 so as to be movable with respect to the image stabilizing unit 410, as described later.

On one face on the side to which the flexible wiring substrate 4 of the printed wiring board 9 is connected, the second electrode 10 is provided on the surface layer thereof as described later. The frame 17 is attached and arranged on a circumferential portion of the other face of the printed wiring board 9. The cover glass 16 is attached on the frame 17 so as to be parallel to the printed wiring board 9.

The imaging sensor element 15 is an image pickup element formed of a semiconductor element, for example. Specifically, the imaging sensor element 15 is a solid state image pickup element such as a complementary metal oxide semiconductor (CMOS) image sensor or a charge coupled device (CCD) image sensor, for example. The imaging sensor element 15 is attached at the printed wiring board 9 in the hollow portion surrounded by the printed wiring board 9, the cover glass 16, and the frame 17 so as not to contact with the cover glass 16. The imaging sensor element 15 is electrically connected to a wiring pad 23 of the printed wiring board 9 via a metal wire 18. The wiring pad 23 is plated with Au, for example.

The image stabilizing unit 410 supports the metal frame 22 such that the imaging sensor module 14 fixed on the metal frame 22 is movable in the X direction and the Y direction and rotatable in the θ direction. The image stabilizing unit 410 can perform image stabilization by moving or rotating the imaging sensor module 14 in response to a camera shake. The image stabilizing unit 410 has an L-shape, for example, and is formed to support the metal frame 22 having a rectangular external shape from the sides of two edges adjacent to the metal frame 22.

Note that, in the present embodiment, while the case where the frame 17 is attached is described, the arrangement place thereof is not limited on the circumferential portion of the printed wiring board 9. Further, the arrangement place of the imaging sensor element 15 may be inside the hollow part of the printed wiring board 9 having a counter-boring such as a cavity substrate, for example.

The printed wiring board 9 on which the imaging sensor element 15 is provided has a printed wiring base member 6, a wiring layer 7, and a solder resist layer 8. The printed wiring board 9 is formed such that the plurality of wiring layers 7 are stacked via the printed wiring base member 6. Unlike the flexible wiring substrate 4, the printed wiring board 9 is a rigid wiring substrate.

For example, the printed wiring board 9 may be formed of a glass epoxy material or may be formed of a ceramic substrate. Further, a printed circuit board in which the imaging sensor element 15 is arranged on a ceramic substrate, and the ceramic substrate and the printed wiring board 9 are connected to each other by the pair of electrodes via the solder 11 can be used. For example, a land grid array (LGA) type or ceramic leadless chip carrier (CLCC) type imaging sensor unit can also be used.

Note that, in the present embodiment, while the case where the number of wiring layers 7 in the printed wiring board 9 is four is described, the number of wiring layers is not limited to four. The wiring layers 7 in the printed wiring board 9 may be formed of a single layer or multiple layers, that is, four layers or less or four layers or more.

Further, although not illustrated, the minimum components required for the operation of the image pickup unit 400 are mounted on the printed wiring board 9.

The printed wiring base member 6 is an insulating base member having a substrate shape formed of a hard composite material or the like, for example. Unlike the flexible base member 1, the printed wiring base member 6 is a hard material. An insulator forming the printed wiring base member 6 only needs to have electrical insulation. For example, the printed wiring base member 6 may be a resin substrate in which an epoxy resin or the like are cured or a ceramic substrate using ceramic.

The wiring layer 7 is a conductive layer formed of a copper foil, other metal foils, or the like. The wiring layer 7 has a wiring pattern. The wiring layer 7 is formed on one side or both sides of the printed wiring base member 6. Further, one or multiple layers of the wiring layers 7 are formed inside the printed wiring base member 6. FIG. 2 and FIG. 3 illustrate the case where total four layers of the wiring layers 7 are formed on both sides of and inside the printed wiring base member 6. Further, inside the printed wiring base member 6, a via 13 electrically connecting the wiring layers 7 to each other is formed. A conductor forming the wiring layer 7, the via 13, or the like is a material having higher conductivity and higher thermal conductivity than the insulator, for example, a metal such as Cu or Au.

The solder resist layer 8 is an insulating protection film that protects a circuit formed of the wiring layer 7. The solder resist layer 8 is formed of a cured liquid solder resist, a film-like solder resist, or the like. The solder resist layer 8 is formed so as to cover the wiring layer 7 on one face on the side to which the flexible wiring substrate 4 of the printed wiring board 9 is connected. Further, the solder resist layer 8 is formed so as to cover the wiring layer 7 on the other face on the side to which the imaging sensor element 15 of the printed wiring board 9 is attached.

An opening from which the wiring layer 7 is exposed is formed in the solder resist layer 8. The exposed portion of the wiring layer 7 forms the second electrode 10. A plurality of second electrodes 10 are aligned at a predetermined pitch, for example. The second electrode 10 is arranged at the center portion of the printed wiring board 9, for example. In such a way, the second electrode 10 formed of the wiring layer 7 is provided on the surface layer of the printed wiring board 9. The second electrode 10 provided on the surface layer is electrically connected to the first electrode 5 of the flexible wiring substrate 4 via the solder 11 that is a conductive connection member.

Note that, when the first electrode 5 and the second electrode 10 are connected to each other by using the solder 11, the first electrode 5 and the second electrode 10 can be adhered to the solder 11 and connected to each other in the state where a connection member containing the solder 11 is heated at a temperature above the melting point of the solder 11. Further, as the solder 11, Sn-3.0Ag-0.5Cu solder or Sn-58Bi solder may be supplied and pasted together with flux, for example. Further, instead of the solder 11, a conductive adhesive agent or the like can be used for a conductive connection member that connects the first electrode 5 and the second electrode 10 to each other.

As described above, in the connection portion 19 between the flexible wiring substrate 4 on which the first electrode 5 and the second electrode 10 are connected to each other and the printed wiring board 9, a reinforcement member 21 that reinforces the connection portion 19 is provided. The reinforcement member 21 is provided on the back surface side of the flexible base member 1 that is a face opposite to the face on which the first electrode 5 is exposed in the flexible wiring substrate 4. The reinforcement member 21 provided on the back surface side of the flexible base member 1 may be provided on the back surface of the flexible base member 1 or may be provided above the back surface of the flexible base member 1 via a wiring layer, an insulating layer, or the like.

As illustrated in FIG. 1, the reinforcement member 21 is provided on both end parts in the width direction (shorter direction) of the flexible wiring substrate 4 along the Y direction at the longitudinal end part on the connection portion 19 side of the flexible base member 1 of the flexible wiring substrate 4. Note that the reinforcement member 21 may be provided on both end parts of the flexible base member 1 in the width direction of the flexible wiring substrate 4 and may be provided across the width direction of the flexible wiring substrate 4 as with the third embodiment described later.

Further, as illustrated in FIG. 3, the reinforcement member 21 is formed on the flexible base member 1 so as to continuously cover both of the end part of the solder 11 on the cover lay 3 side and the end part of the cover lay 3 on the solder 11 side via the flexible base member 1 and the flexible wiring layer 2. That is, the reinforcement member 21 continuously covers the end part of the cover lay 3 on the side closer to the first electrode 5 and the end part of the portion that is connected to the first electrode 5 of the solder 11 and is on the side closer to the cover lay 3.

The reinforcement member 21 is not particularly limited and may be a cured material of a resin such as an ultraviolet (UV) curable resin, a thermosetting resin, or the like, for example. Further, the reinforcement member 21 may be a reinforcement film attached to the same places on the face of the flexible base member 1 besides the cured material of a resin.

Herein, the flexible wiring substrate 4 connected to the printed wiring board 9 includes a fixed portion 4a that is a portion in which the first electrode 5 is connected and fixed to the second electrode 10 via the solder 11 and an unfixed portion 4b that is a portion other than the fixed portion 4a. The unfixed portion 4b may be bent to the direction away from the printed wiring board 9 with respect to the fixed portion 4a. The reinforcement member 21 provided as described above is bridged between the fixed portion 4a and the unfixed portion 4b. With the presence of such a reinforcement member 21, an angle θb at which the unfixed portion 4b is bent to the fixed portion 4a is maintained at an obtuse angle. Note that the reinforcement member 21 can be formed of any deformable material, thickness, area, shape, and the like as long as the angle θb at which the unfixed portion 4b is bent to the fixed portion 4a can be maintained at an obtuse angle. In such a way, the image pickup unit 400 according to the present embodiment is configured.

In recent years, an image stabilizing unit that moves an imaging sensor itself for performing image stabilization is mounted inside a digital camera. In the image stabilizing unit, not only a conventional static load but also a dynamic load during image stabilization such as a vibration are superimposed and generated in the plane XY directions and the rotation θ direction, for example. Thus, a flexible wiring substrate that connects a rigid wiring board on which an imaging sensor is mounted to a rigid wiring board on which an LSI for image processing is mounted is required to have flexibility that does not impair the drive of the image stabilizing unit and junction strength against repeated loads.

In contrast, in the image pickup unit 400 according to the present embodiment, as described above, the reinforcement member 21 is provided so as to continuously cover both of the end part of the solder 11 on the cover lay 3 side and the end part of the cover lay 3 on the solder 11 side in the connection portion 19. The reinforcement member 21 provided as described above causes the connection portion 19 between the flexible wiring substrate 4 and the printed wiring board 9 to have locally high rigidity. Thus, in the present embodiment, it is possible to reduce deformation behavior near the connection portion 19 involved during the drive of the image stabilizing unit 410 to be smaller. At the same time, in the present embodiment, since a bending angle θb of the flexible wiring substrate 4 during driving can be maintained at an obtuse angle, it is possible to reduce the load on the connection portion 19. Moreover, in the present embodiment, since only the connection portion 19 is caused to have high rigidity and reinforced locally, and not the entire flexible wiring substrate 4 is reinforced, flexibility of the flexible wiring substrate 4 is not lost. Therefore, according to the present embodiment, it is possible to reduce the load on the connection portion 19 without impairing the operation of the image stabilizing unit 410.

As described above, according to the present embodiment, it is possible to reduce a load occurring in the connection portion 19 between the flexible wiring substrate 4 and the printed wiring board 9 without losing flexibility of the flexible wiring substrate 4.

Note that, in FIG. 1, although the case where the reinforcement member 21 is provided only on both the ends in the width direction along the Y directions of the flexible wiring substrate 4 is illustrated, the embodiment is not limited thereto. The reinforcement member 21 may be provided over the entire surface in the width direction or may be provided so as to protrude from a part on the flexible wiring substrate 4 to a part on the printed wiring board 9 in the width direction of the flexible wiring substrate 4.

Further, in FIG. 2 and FIG. 3, although the case where the reinforcement member 21 is provided to cover the end part of the solder 11 on the cover lay 3 side is illustrated, the embodiment is not limited thereto. The reinforcement member 21 may be provided so as to cover a part up to one longitudinal end part of the flexible wiring substrate 4 or may be provided so as to protrude from a part on the flexible wiring substrate 4 to a part on the solder resist layer 8 of the printed wiring board 9.

Second Embodiment

Figure 4:
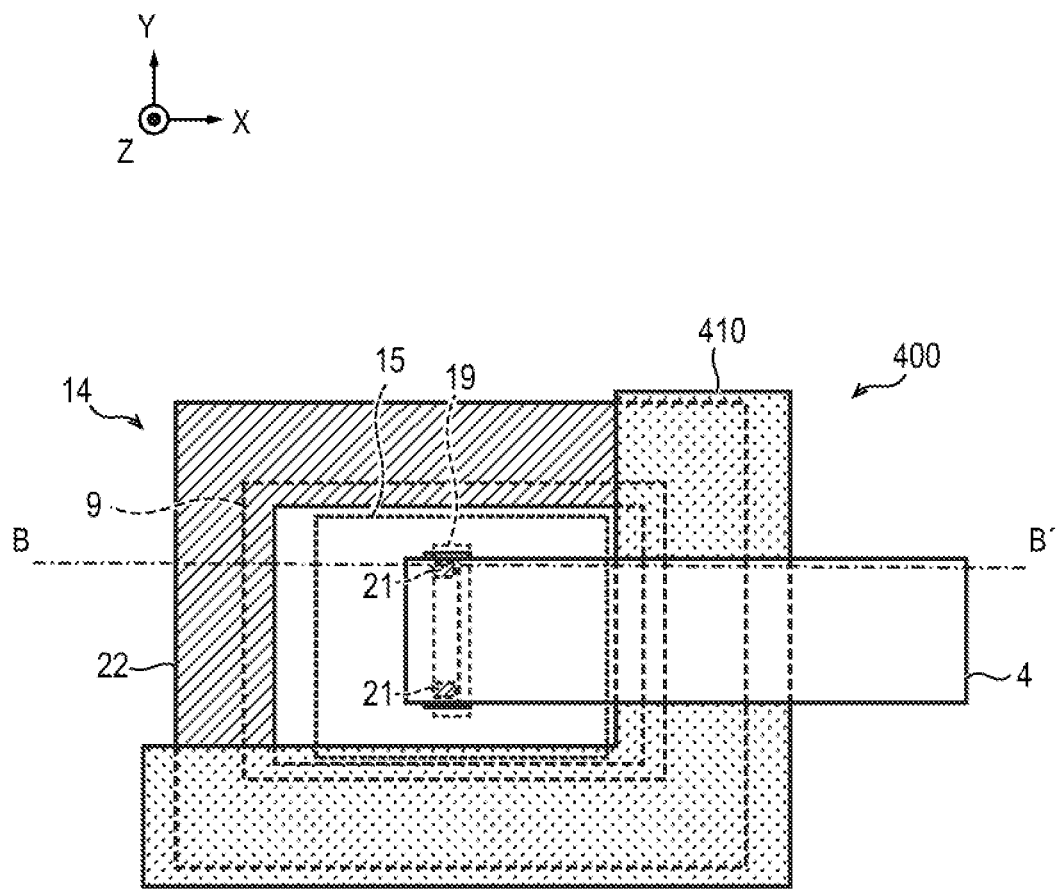
FIG. 4 is a top view illustrating a general configuration of an image pickup unit according to a second embodiment.
Figure 5:
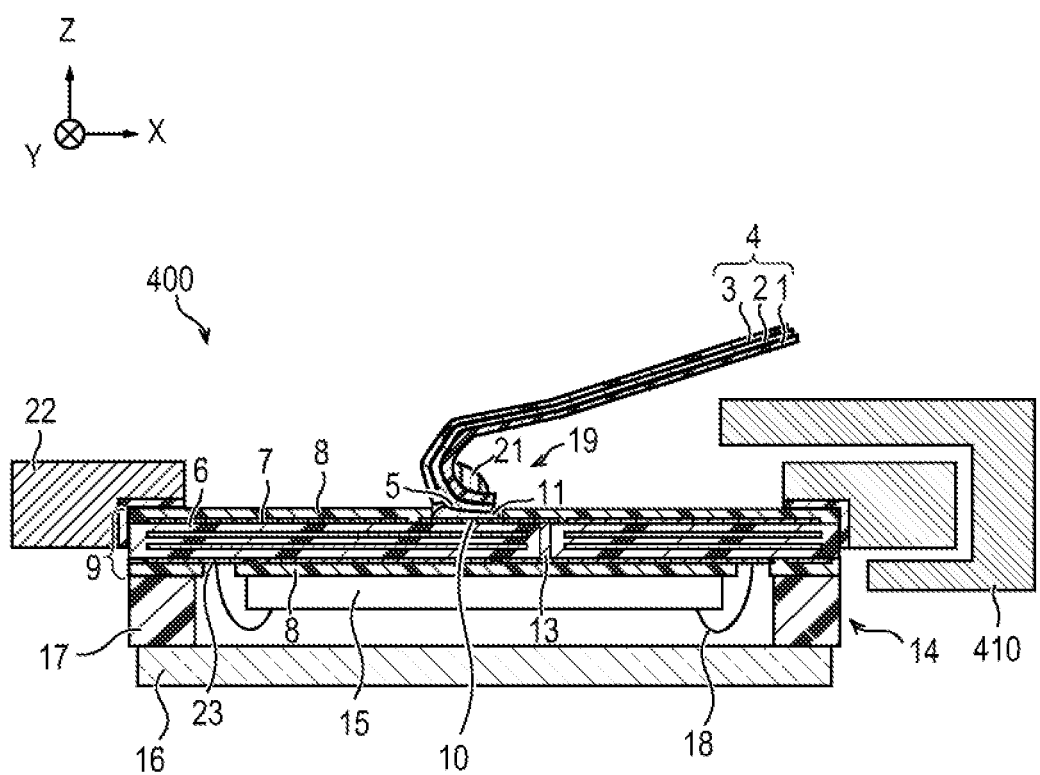
FIG. 5 is a schematic sectional view illustrating a general configuration of the image pickup unit according to the second embodiment.
Figure 6:
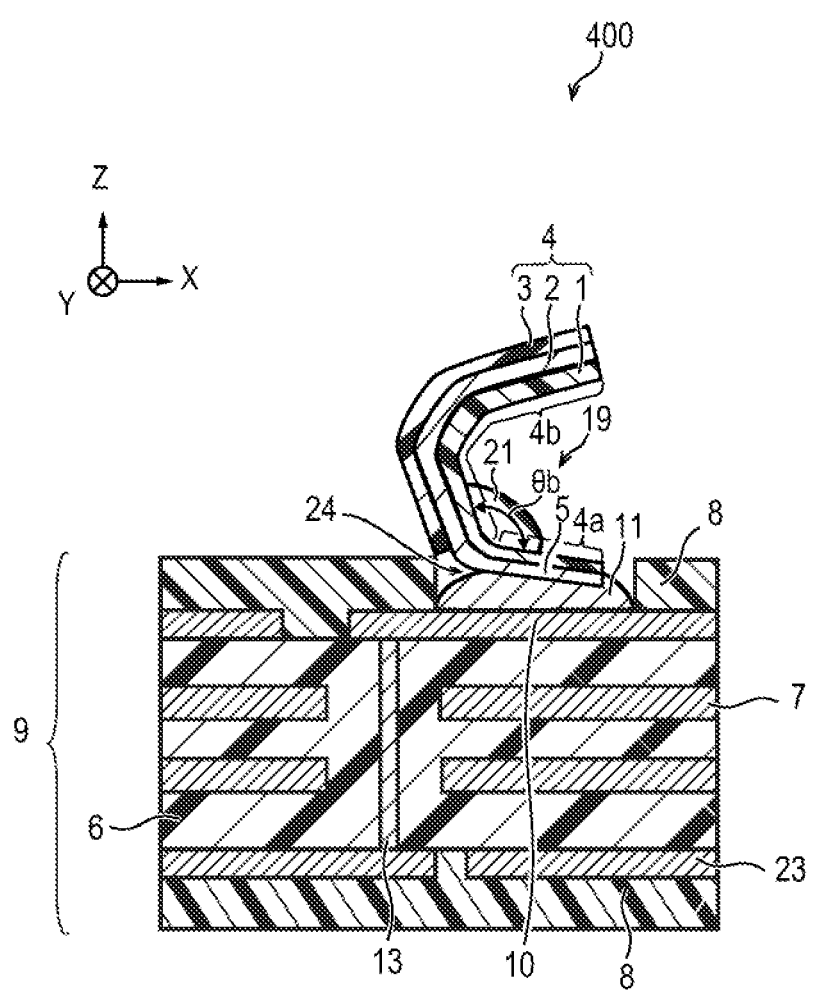
FIG. 6 is an enlarged schematic sectional view illustrating a connection portion between a flexible wiring substrate and a printed wiring board of the image pickup unit according to the second embodiment.

Next, the image pickup unit 400 according to a second embodiment will be described with reference to FIG. 4, FIG. 5, and FIG. 6. FIG. 4 is a schematic top view illustrating a general configuration of the image pickup unit 400 according to the present embodiment. FIG. 5 is a schematic sectional view illustrating the general configuration of the image pickup unit 400 according to the present embodiment and illustrates a cross section taken along a line B-B' in FIG. 4. FIG. 6 is a schematic sectional view illustrating an enlarged connection portion 19 between the flexible wiring substrate 4 and the printed wiring board 9 of the image pickup unit 400 according to the present embodiment and illustrates the enlarged connection portion 19 of FIG. 5.

In the present embodiment, the form in which the flexible wiring substrate 4 is arranged to the printed wiring board 9 is different from that of the first embodiment. Note that, since the remaining configuration is the same as that of the first embodiment, the description of the same configuration will be omitted.

In the first embodiment, with respect to the connection portion 19, the flexible wiring substrate 4 is arranged so as to extend without being bent in the +X direction on the side of the image processing unit (not illustrated) that is a connecting component to which the other longitudinal end part opposite to one longitudinal end part on the connection portion 19 side is connected.

On the other hand, in the present embodiment, with respect to the connection portion 19, the flexible wiring substrate 4 is arranged so as to extend in the -X direction opposite to the +X direction on the side of the image processing unit (not illustrated) that is a connecting component to which the other longitudinal end part is connected. Furthermore, the flexible wiring substrate 4 extending in the -X direction is bent in the +X direction on the side of the image processing unit above the printed wiring board 9.

That is, in the present embodiment, as illustrated in FIG. 4, FIG. 5, and FIG. 6, the flexible wiring substrate 4 is connected to the printed wiring board 9 with the first electrode 5 being connected to the second electrode 10 via the solder 11 such that one longitudinal end part faces the +X direction that is opposite to the case of the first embodiment. Furthermore, the flexible wiring substrate 4 is in a bent state of being once folded from the opposite side of the image stabilizing unit 410 to the side of the image stabilizing unit 410 such that the other longitudinal end part is located on the side of the image stabilizing unit 410 and the image processing unit that is a connecting component thereof. In such a way, in the present embodiment, the flexible wiring substrate 4 is folded and bent from the opposite side of the image stabilizing unit 410 and the image processing unit to the side of the image stabilizing unit 410 and the image processing unit.

Also in the present embodiment, the reinforcement member 21 is provided in the same manner as the first embodiment to the flexible wiring substrate 4 folded as described above. In such a way, in the present embodiment, the flexible wiring substrate 4 is in a bent state. In the present embodiment, in the bent flexible wiring substrate 4, the reinforcement member 21 is provided in the same manner as in the first embodiment. Thus, also in the present embodiment, it is possible to reduce a load that may occur in the connection portion 19 between the flexible wiring substrate 4 and the printed wiring board 9 without losing flexibility of the flexible wiring substrate 4.

Note that, although FIG. 4 illustrates the case where the reinforcement members 21 are provided only on both ends in the width direction along the Y-direction of the flexible wiring substrate 4, the embodiment is not limited thereto. The reinforcement member 21 may be provided over the entire face in the width direction or may be provided so as to protrude from a part on the flexible wiring substrate 4 to a part on the printed wiring board 9 in the width direction of the flexible wiring substrate 4.

Further, although FIG. 5 and FIG. 6 illustrate the case where the reinforcement member 21 is provided so as to cover the end part of the solder 11 on the cover lay 3 side, the embodiment is not limited thereto. The reinforcement member 21 may be provided so as to cover a part up to one longitudinal end part of the flexible wiring substrate 4 or may be provided so as to protrude from a part on the flexible wiring substrate 4 to a part on the solder resist layer 8 of the printed wiring board 9.

Note that, in the present embodiment, the number of flexible wiring substrates 4 may be two or greater without being limited to one. Furthermore, the connection position between the flexible wiring substrate 4 and the printed wiring board 9 is not limited to the center of the printed wiring board 9 and may be the end of the printed wiring board 9. Further, when a plurality of flexible wiring substrates 4 are mounted, one of the positions thereof can be the center of the printed wiring board 9, and another one of the positions can be the end of the printed wiring board 9, for example.

Third Embodiment

Figure 7:
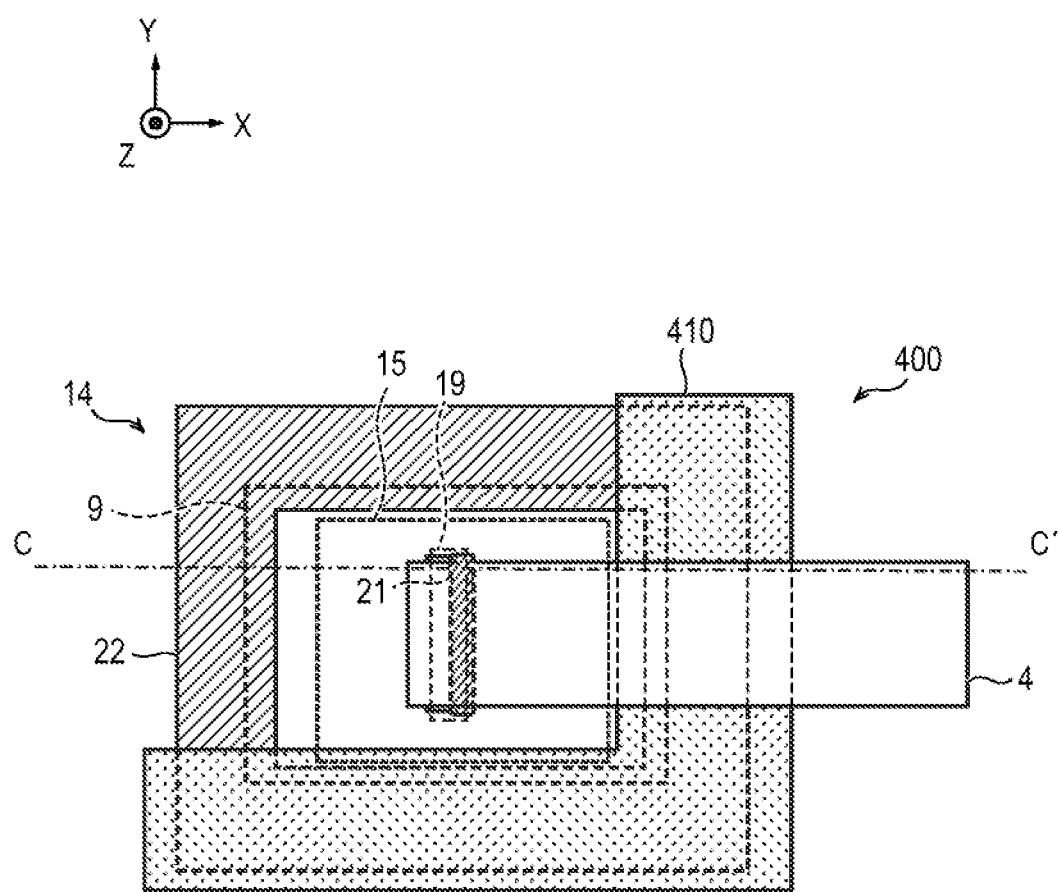
FIG. 7 is a top view illustrating a general configuration of an image pickup unit according to a third embodiment.
Figure 8:
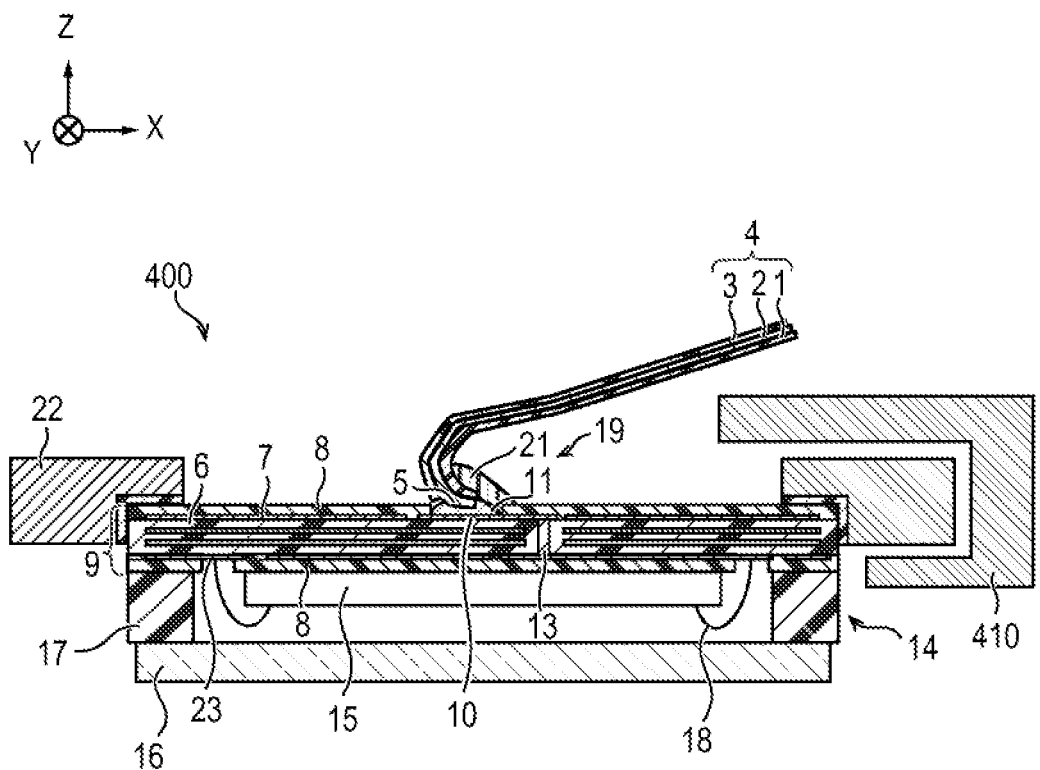
FIG. 8 is a schematic sectional view illustrating a general configuration of the image pickup unit according to the third embodiment.

Next, the image pickup unit 400 according to a third embodiment will be described with reference to FIG. 7, FIG. 8, and FIG. 9. FIG. 7 is a schematic top view illustrating a general configuration of the image pickup unit 400 according to the present embodiment. FIG. 8 is a schematic sectional view illustrating the general configuration of the image pickup unit 400 according to the present embodiment and illustrates a cross section taken along a line C-C' in FIG. 7. FIG. 8 is a schematic sectional view illustrating an enlarged connection portion 19 between the flexible wiring substrate 4 and the printed wiring board 9 of the image pickup unit 400 according to the present embodiment and illustrates the enlarged connection portion 19 of FIG. 7.

In the present embodiment, the region in which the reinforcement member 21 is provided is different from that of the second embodiment. Note that, since the remaining configuration is the same as that of the second embodiment, the description of the same configuration will be omitted.

That is, in the present embodiment, as illustrated in FIG. 7, the reinforcement member 21 is provided in a wider region than the width of the flexible wiring substrate 4 across the entire face of the width direction (shorter direction) of the flexible wiring substrate 4 along the Y direction. That is, the reinforcement member 21 is provided so as to protrude from a part on the flexible base member 1 of the flexible wiring substrate 4 to a part on the solder resist layer 8 of the printed wiring board 9 in the width direction of the flexible wiring substrate 4.

Figure 9:
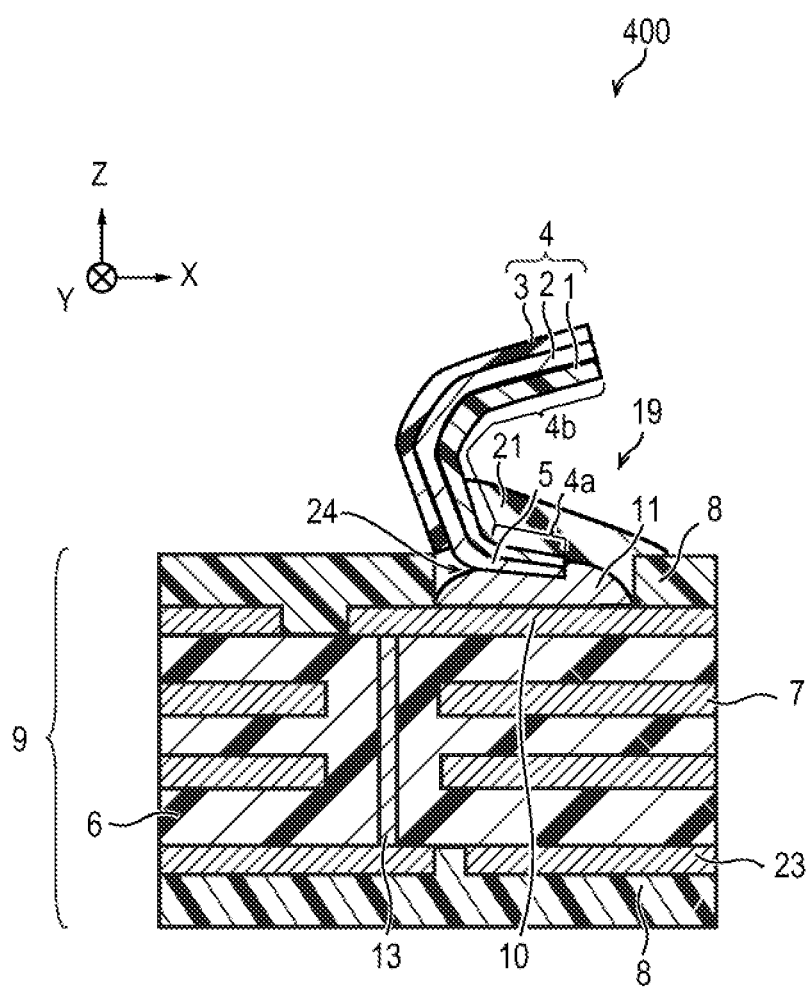
FIG. 9 is a schematic sectional view illustrating a connection portion between a flexible wiring substrate and a printed wiring board of the image pickup unit according to the third embodiment.

Further, in the present embodiment, as illustrated in FIG. 7, FIG. 8, and FIG. 9, the reinforcement member 21 is provided by being applied up to the upper face of the solder resist layer 8 beyond one longitudinal end part on the connection portion 19 side of the flexible wiring substrate 4 in the longitudinal direction of the flexible wiring substrate 4 along the X direction. That is, in the longitudinal direction of the flexible wiring substrate 4, the reinforcement member 21 is provided so as to protrude from a part on the flexible base member 1 of the flexible wiring substrate 4 to a part on the solder resist layer 8 of the printed wiring board 9.

Also in the present embodiment, with the use of the reinforcement member 21 provided as described above, it is possible to reduce a load that may occur in the connection portion 19 between the flexible wiring substrate 4 and the printed wiring board 9 without losing flexibility of the flexible wiring substrate 4. By changing the region in which the reinforcement member 21 is provided, it is possible to adjust the level of local increase in rigidity of the connection portion 19 to reduce a load occurring in the connection portion 19 in accordance with the flexibility required for the flexible wiring substrate 4.

Note that, also in the first embodiment, the reinforcement member 21 can be provided in the same region as in the present embodiment.

Further, the reinforcement member 21 may be provided so as to protrude from a part on the flexible base member 1 of the flexible wiring substrate 4 to a part on the solder resist layer 8 of the printed wiring board 9 in either one of the width direction and the longitudinal direction of the flexible wiring substrate 4.

Fourth Embodiment

Figure 10:
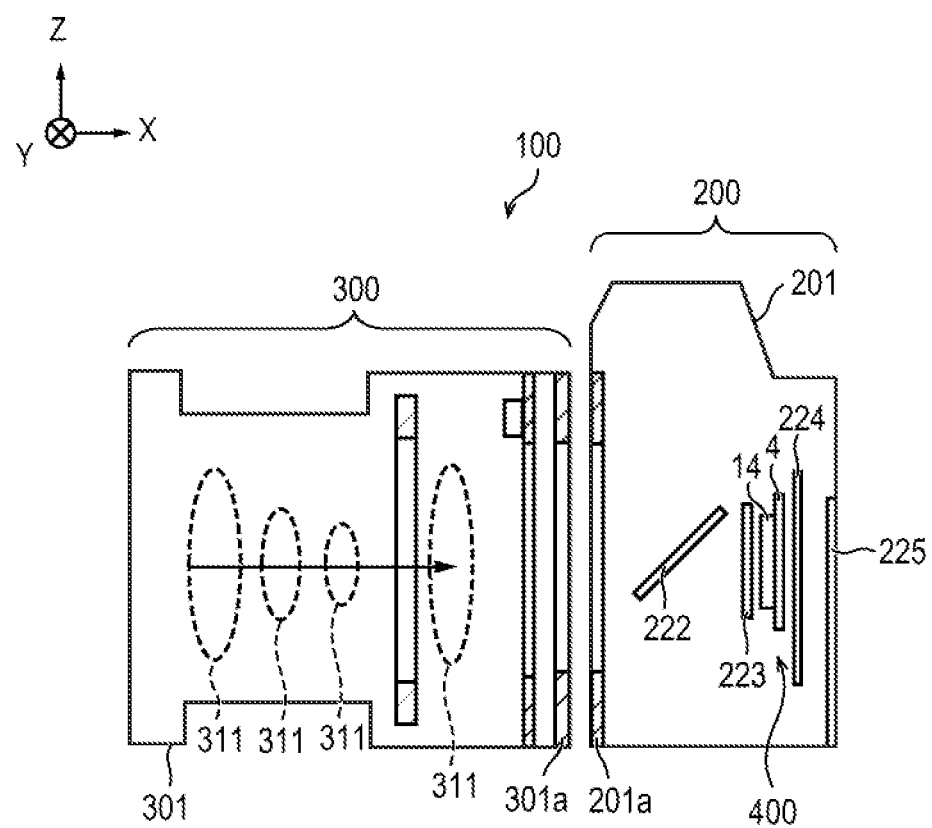
FIG. 10 is an illustration diagram illustrating a general configuration of an imaging apparatus that is as an example of an electronic apparatus according to a fourth embodiment.

Next, an electronic apparatus according to a fourth embodiment will be described with reference to FIG. 10. FIG. 10 is a schematic diagram illustrating a general configuration of an imaging apparatus as an example of an electronic apparatus according to the present embodiment.

A digital camera (camera) 100 as the imaging apparatus that is an example of the electronic apparatus according to the present embodiment is a digital single lens reflex camera, for example. As illustrated in FIG. 10, the camera 100 has a camera body 200 and an interchangeable lens 300 (lens barrel) that is detachable from the camera body 200. In FIG. 10, the interchangeable lens 300 is mounted to the camera body 200. A case where the camera 100, which is an imaging apparatus, is configured with the interchangeable lens 300 being mounted to the camera body 200 will be described below.

The camera body 200 has a casing 201 and a mirror 222, a shutter 223, an image pickup unit 400 that is a printed circuit board, and an image processing circuit 224 that are arranged inside the casing 201. Further, the camera body 200 has a liquid crystal display 225 fixed to the casing 201 so as to be exposed out of the casing 201.

The image pickup unit 400 has a configuration illustrated in the first embodiment to the third embodiment described above and includes an image stabilizing unit 410, the imaging sensor module 14 having the printed wiring board 9, and the flexible wiring substrate 4.

The interchangeable lens 300 has a casing 301, which is an interchangeable lens casing, and an imaging optical system 311. The imaging optical system 311 is arranged inside the casing 301 and, when the casing 301 (interchangeable lens 300) is mounted to the casing 201, captures an optical image onto the imaging sensor module 14. The imaging optical system 311 is configured having a plurality of lenses.

The casing 301 of the interchangeable lens 300 has a lens-side mount 301a formed with an opening. On the other hand, the casing 201 of the camera body 200 has a camera-side mount 201a formed with an opening. When the lens-side mount 301a and the camera-side mount 201a are fit to each other, the interchangeable lens 300 (casing 301) is mounted to the camera body 200 (casing 201). Note that the arrow X direction illustrated in FIG. 10 is the optical axis direction of the imaging optical system 311.

Light traveling in the arrow X direction through the imaging optical system 311 is guided into the casing 201 through the opening in the lens-side mount 301a of the casing 301 and the opening in the camera-side mount 201a of the casing 201. The mirror 222, the shutter 223, and the like are provided along the arrow X direction in front of the image pickup unit 400 in the arrow X direction inside the casing 201.

The imaging sensor element 15 in the imaging sensor module 14 is a solid state image pickup element such as a CMOS image sensor, a CCD image sensor, or the like that photoelectrically converts an optical image captured through the imaging optical system 311.

As described above, the camera 100 that is an imaging apparatus including the image pickup unit 400 is configured.

As set forth, according to the present embodiment, it is possible to reduce a load occurring in the connection portion 19 between the flexible wiring substrate 4 and the printed wiring board 9 even when the digital single lens reflex camera 100 is dropped and impacted or the like, for example, and it is thus possible to improve the performance.

Note that, although the case where the interchangeable lens 300 is mounted to the camera body 200 has been described in the present embodiment, the embodiment is not limited thereto. In the case of only the camera body 200 without the interchangeable lens 300 being mounted, the camera body 200 is an imaging apparatus.

Further, although the case where the camera 100 is divided into the camera body 200 and the interchangeable lens 300 has been described in the present embodiment, the camera 100 may be an integrated type camera 100 having a lens built in the camera body 200.

Furthermore, although the camera 100 has been described as an imaging apparatus that is an electronic apparatus in the present embodiment, the embodiment is not limited thereto.

Example 1

The image pickup unit 400 according to the first embodiment illustrated in FIG. 1, FIG. 2, and FIG. 3 was manufactured as an image pickup unit of Example 1. In the image pickup unit 400 of Example 1, a resin frame having a thickness of 2 mm was used as the frame 17. A CMOS image sensor having a rectangular planer shape of 30 mm×20 mm was used as the imaging sensor element 15. A rectangular planar shape cover glass of 28 mm×38 mm was used as the cover glass 16.

A flexible wiring substrate in which the material of the flexible base member 1 and the cover lay 3 is polyimide and the material of the flexible wiring layer 2 and the first electrode 5 is Cu was used as the flexible wiring substrate 4. The thickness of the flexible base member 1 was 25 µm, the thickness of the cover lay 3 was 12 µm, and the thickness of the flexible wiring layer 2 was 18 µm.

The printed wiring board having a rectangular external shape of 30 mm×40 mm in which the material of the printed wiring base member 6 was a glass epoxy material and the material of the wiring layer and the second electrode 10 was Cu was used as the printed wiring board 9. The thickness of the wiring layer 7 and the second electrode 10 was about 30 µm, and the thickness of the solder resist layer 8 was about 25 µm. Further, a UV curable resin was used as an adhesive agent used for fixing the printed wiring board 9 to the metal frame 22. A metal frame having an external shape of 50 mm×60 mm was used as the metal frame 22.

The first electrode 5 of the flexible wiring substrate 4 and the second electrode 10 of the printed wiring board 9 are connected to each other by the solder 11. For the second electrodes 10, the pitch was 0.2 mm, the width of the electrode was 0.15 mm, and the number of wirings was 80.

Further, the opening of the solder resist layer 8 from which the second electrode 10 is exposed had a size of 1.1 mm×20 mm. On the other hand, for the first electrodes 5, the pitch was 0.2 mm, the width of the electrode was 0.15 mm, and the number of wirings was 80. The width of the flexible wiring substrate 4 was 22 mm, which was larger than the opening width 20 mm of the solder resist layer 8. The pitch of electrodes, the width of electrodes, the wide between electrodes, and the number of electrodes were set in accordance with the specification of the imaging sensor module 14 as appropriate.

The length in the X direction of the exposed portion 24 in the gap between the cover lay 3 and the solder 11 was 1 mm. Solder whose material was Sn-3.0-Ag-0.5Cu was used as the solder 11. An image stabilizing unit having an L-shape obtained by cutting a rectangle of 70 mm×55 mm off from the rectangle of 85 mm×70 mm was used as the image stabilizing unit 410.

A UV curable resin was used as the reinforcement member 21. The thickness of the reinforcement member 21 was 0.5 mm. Further, the reinforcement members 21 were provided to both ends with respect to the width direction of the flexible wiring substrate 4 when viewed from the top face. The reinforcement member 21 was provided so as to cover the gap between cover lay 3 and the solder 11 and cover a length of 0.5 mm from the end part of the cover lay 3 to a region in the opposite direction of the connection portion 19 to the flexible wiring substrate 4. Furthermore, the reinforcement member 21 was provided so as to cover a length of 0.5 mm from the joint portion between the flexible wiring layer 2 and the solder 11 in the direction of the connection portion 19.

The completed imaging apparatus mounted with the image pickup unit 400 of Example 1 was an imaging apparatus that can sufficiently guarantee the optical performance of the built-in CMOS image sensor.

Example 2

The image pickup unit 400 according to the third embodiment illustrated in FIG. 7, FIG. 8, and FIG. 9 was manufactured as an image pickup unit of Example 2. In the image pickup unit 400 of Example 2, the flexible wiring substrate 4 was drawn to the opposite side of the image stabilizing unit 410 and folded once as illustrated in FIG. 7. Further, as illustrated in FIG. 8, the reinforcement region provided with the reinforcement member 21 was a wider region than the width of the flexible wiring substrate 4. Furthermore, as illustrated in FIG. 9, the reinforcement member 21 was applied up to a part on the solder resist layer 8 beyond the longitudinal end of the connection portion 19 of the flexible wiring substrate 4.

The same flexible wiring substrate 4 as that of Example 1 was used as the flexible wiring substrate 4. Also, the same printed wiring board 9 as that of Example 1 was used as the printed wiring board 9. Further, the same UV curable resin as that of Example 1 was used as the reinforcement member 21.

The completed imaging apparatus mounted with the image pickup unit 400 of Example 2 was an imaging apparatus that can sufficiently guarantee the optical performance of the built-in CMOS image sensor. Further, in Example 2, the load occurring in the connection portion 19 between the flexible wiring substrate 4 and the printed wiring board 9 was reduced while the flexibility of the flexible wiring substrate 4 was maintained even when the flexible wiring substrate 4 was bent. Furthermore, in Example 2, since the reinforcement member 21 is provided in a wider region than the width of the flexible wiring substrate 4, not only the load occurring in the connection portion 19 but also the load occurring in the flexible base member 1 was reduced.

Evaluation by Structure Analysis

To confirm the advantageous effect of the present invention, an example in which a structure including the flexible wiring substrate 4 and the printed wiring board 9 was simplified to perform structure analysis thereon is illustrated.

As illustrated in FIG. 11 to FIG. 15, structure analysis was performed on Comparative Example 1 in which the reinforcement member 21 is not arranged on the flexible base member 1 and on Comparative Examples 2, 3, and 4 and Example 3 in which the reinforcement member 21 is arranged on the flexible base member 1 at different places from each other.

Figure 11:
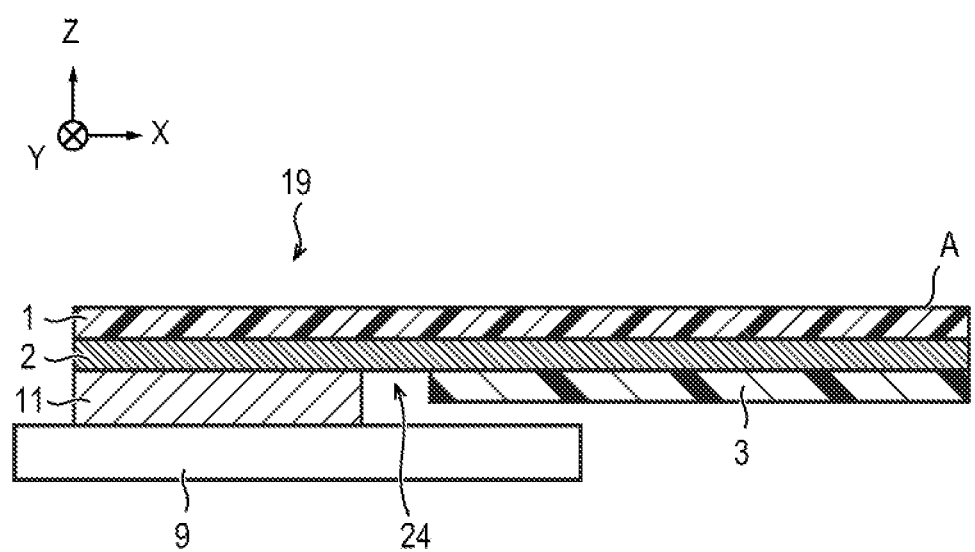
FIG. 11 is a schematic diagram illustrating a three-dimensional structure analysis model according to Comparative Example 1.
Figure 12:
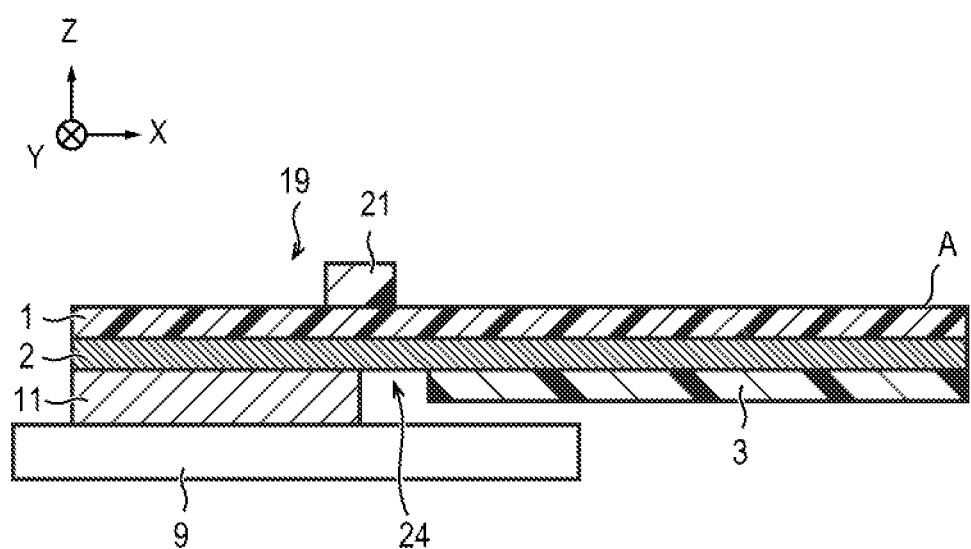
FIG. 12 is a schematic diagram illustrating a three-dimensional structure analysis model according to Comparative Example 2.
Figure 13:
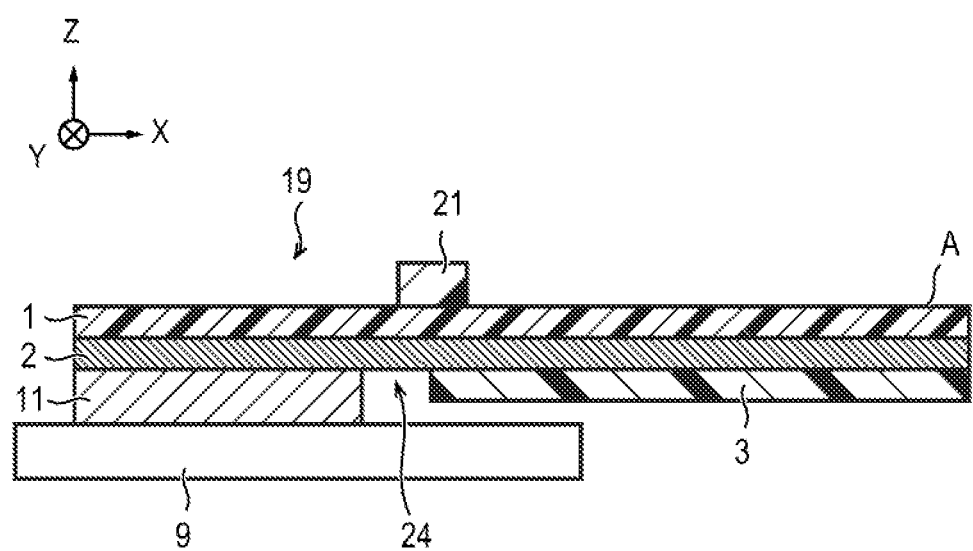
FIG. 13 is a schematic diagram illustrating a three-dimensional structure analysis model according to Comparative Example 3.
Figure 14:
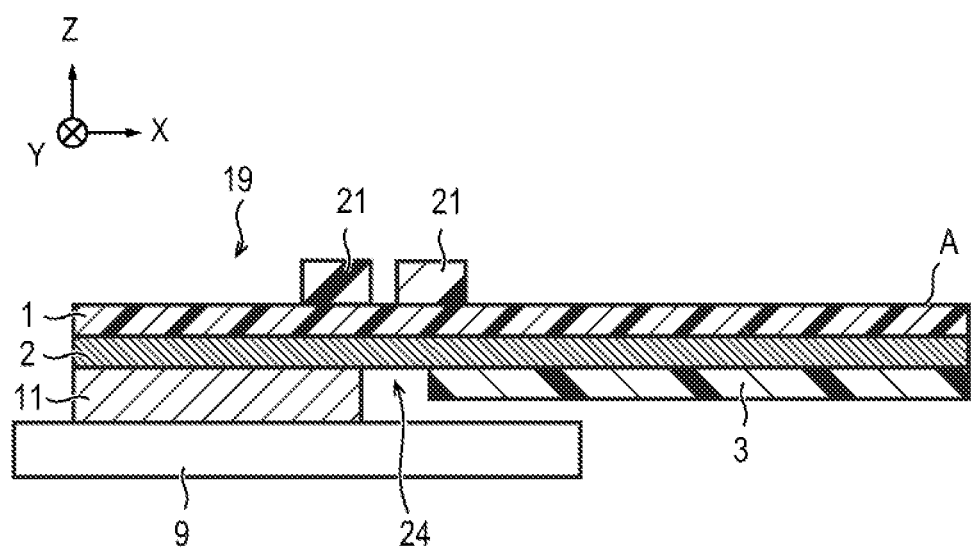
FIG. 14 is a schematic diagram illustrating a three-dimensional structure analysis model according to Comparative Example 4.

That is, FIG. 11 is a schematic diagram illustrating the structure as Comparative Example 1 in which the flexible wiring substrate 4 is connected onto the printed wiring board 9 by using the solder 11. FIG. 12 is a schematic diagram illustrating the structure as Comparative Example 2 in which, in addition to the structure of Comparative Example 1, the reinforcement member 21 is arranged at a place that includes the end part of the solder 11 on the cover lay 3 side and does not include the end part of the cover lay 3 on the solder 11 side. FIG. 13 is a schematic diagram illustrating the structure as Comparative Example 3 in which, in addition to the structure of Comparative Example 1, the reinforcement member 21 is arranged at a place that does not include the end part of the solder 11 on the cover lay 3 side and includes the end part of the cover lay 3 on the solder 11 side. FIG. 14 is a schematic diagram illustrating the structure as Comparative Example 4 in which, in addition to the structure of Comparative Example 1, the reinforcement members 21 are separately arranged at a place including the end part of the solder 11 on the cover lay 3 side and a place including the end part of the cover lay 3 on the solder 11 side, respectively.

Figure 15:
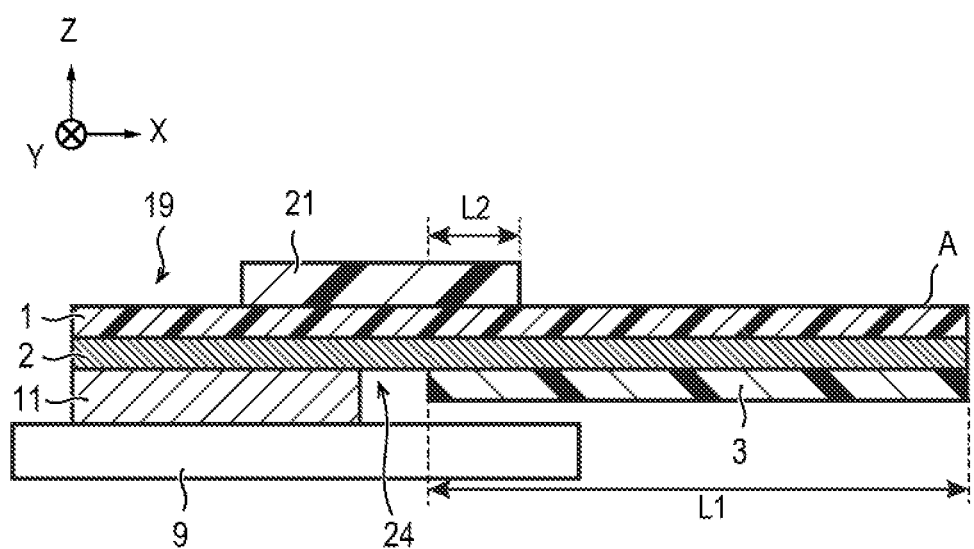
FIG. 15 is a schematic diagram illustrating a three-dimensional structure analysis model according to Example 3.

On the other hand, FIG. 15 is a schematic diagram illustrating the structure as Example 3 in which the reinforcement member 21 is arranged continuously to a place including the end part of the solder 11 on the cover lay 3 side and a place including the end part of the cover lay 3 on the solder 11 side compared to Comparative Example 1.

A structure analysis scheme used in evaluation will be described. ANSYS Mechanical Enterprise Version 19.1 was used as structure analysis software. Three-dimensional analysis was performed as the structure analysis.

The dimensions or the like used in the structure analysis will be described. The printed wiring board 9 had a length of 2.5 mm, a width of 1 mm, and a thickness of 0.8 mm. The solder 11 had a length of 1 mm from a position at 0.75 mm away from the end face of the printed wiring board 9 in the X direction, had a length of 0.1 mm from a position at 0.45 mm away from the end face of the printed wiring board 9 in the Y direction, and had a solder height of 50 μm in the Z direction. The flexible wiring substrate 4 is modeled for respective layers. The flexible wiring layer 2 had a length of 2 mm from the end face of the solder 11 in the X direction, had the same length of 0.1 mm as the solder 11 in the Y direction, and had a thickness of 20 μm in the Z direction. The flexible base member 1 is shaped to be stacked on the flexible wiring layer 2 in the +Z direction and had a thickness of 20 μm in the Z direction. The cover lay 3 is shaped to be stacked on the flexible wiring layer 2 in the −Z direction, had a length of 0.9 mm from a position at 1.1 mm away from the end face of the flexible wiring layer 2 in the X direction, and had a thickness of 20 μm in the −Z direction. That is, the length in the X direction of the exposed portion 24 of the flexible wiring layer 2, which is the gap between the solder 11 and the cover lay 3, was 0.1 mm.

The reinforcement member 21 was a cured material of an epoxy resin, was shaped to be stacked on the flexible base member 1, and had a thickness of 20 μm. In Comparative Example 2, the length in the X direction of the reinforcement member 21 was total 20 μm, namely, each 10 μm in ±X directions with respect to the end part of the solder 11 on the cover lay 3 side as the center, and the length in the Y direction was the same as that of the solder 11. In Comparative Example 3, the length in the X direction of the reinforcement member 21 was total 20 μm, namely, each 10 μm in ±X directions with respect to the end part of the cover lay 3 on the solder 11 side as the center, and the length in the Y direction was the same as that of the solder 11. In Comparative Example 4, the reinforcement member 21 was arranged at the same positions as Comparative Examples 2 and 3 at the same time. In Example 3, the length in the X direction of the reinforcement member 21 was 0.12 mm from a position at 10 μm in the −X direction away from the end part of the solder 11 on the cover lay 3 side to a position at 10 μm in the +X direction away from the end part of the cover lay 3 on the solder 11 side, and the length in the Y direction was the same as that of the solder 11.

The condition of the structure analysis was as follows. In the printed wiring board 9, the node displacement on the back surface, which is a face in the −Z direction not connected to the flexible wiring substrate 4, was defined as 0 in all the X direction, the Y direction, and the Z direction. Furthermore, the end of the flexible wiring substrate 4 opposite to the connection portion 19 was defined as a region A, the plane of the region A was defined to be at a displacement of 0.1 mm in the +Z direction. The structure analysis was performed on all Comparative Examples 1, 2, 3, and 4 and Example 3 under the above conditions.

Figure 16:
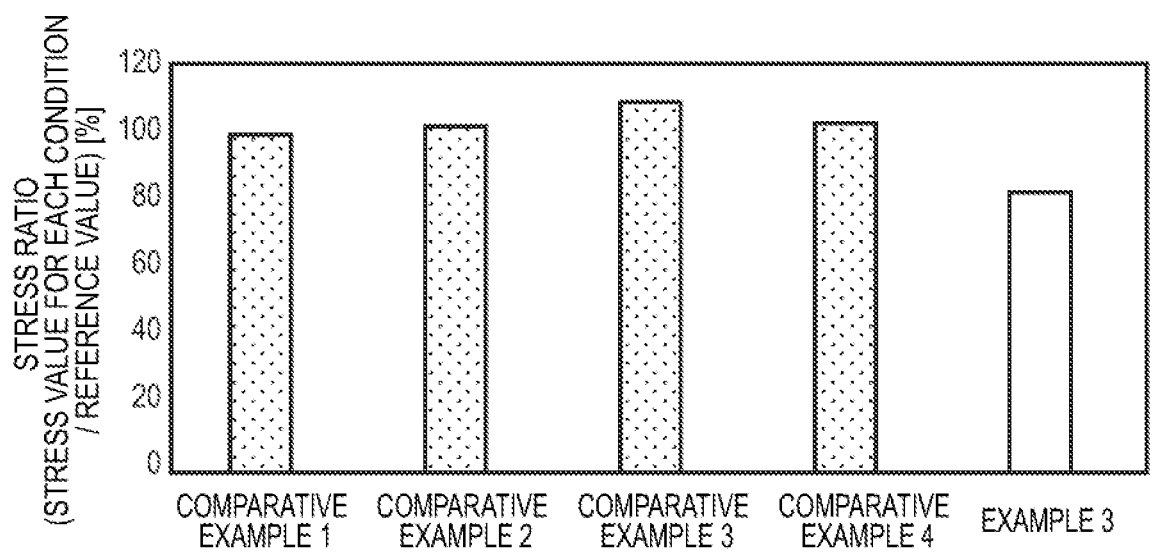
FIG. 16 is a diagram illustrating a result of structure analysis in comparison between Comparative Examples 1, 2, 3, and 4 and Example 3.

The evaluation criterion was the maximum value of a corresponding stress in a non-covered region, which is a region where the solder 11 and the cover lay 3 are not connected to each other in the flexible wiring layer 2. The structure analysis under the conditions described above was performed, and stress values occurring in the flexible wiring layer 2 were compared. FIG. 16 illustrates a stress analysis result from the structure analysis. In FIG. 16, the evaluation axis represents a stress ratio where a stress value of Comparative Example 1 is defined as 100% of the reference value.

As illustrated in FIG. 16, in Example 3, the stress was reduced by about 20% compared to Comparative Examples 1, 2, 3, and 4. It is found from the result illustrated in FIG. 16 that the reinforcing effect is not obtained when the reinforcement member 21 is arranged at a place including only the end part of the solder 11 on the cover lay 3 side as with Comparative Example 2. Further, it is found that the reinforcing effect is not obtained also when the reinforcement member 21 is arranged at a place including only the end part of the cover lay 3 on the solder 11 side as with Comparative Example 3. Furthermore, it is found that the reinforcing effect is not obtained when the reinforcement members 21 are separately arranged even when the reinforcement members 21 are arranged at places including both the end parts as with Comparative Example 4.

Next, to confirm the effect caused by the covering length of the reinforcement member 21 of the present invention, structure analysis was performed by changing a length L1 in the longitudinal direction of the cover lay 3 and a covering length L2 of the reinforcement member 21 in FIG. 15. Note that the length L1 in the longitudinal direction of the cover lay 3 is the length from one end to the other end opposite thereto of the cover lay 3 on the solder 11 side in the longitudinal direction of the flexible wiring substrate 4 along the X direction. The covering length L2 of the reinforcement member 21 is the length of a portion included in the reinforcement member 21, which continuously covers the end part of the solder 11 on the cover lay 3 side and the end part of the cover lay 3 on the solder 11 side in the longitudinal direction in the same manner, and covering the cover lay 3 in the +X direction from one end of the cover lay 3 on the solder 11 side.

Figure 17:
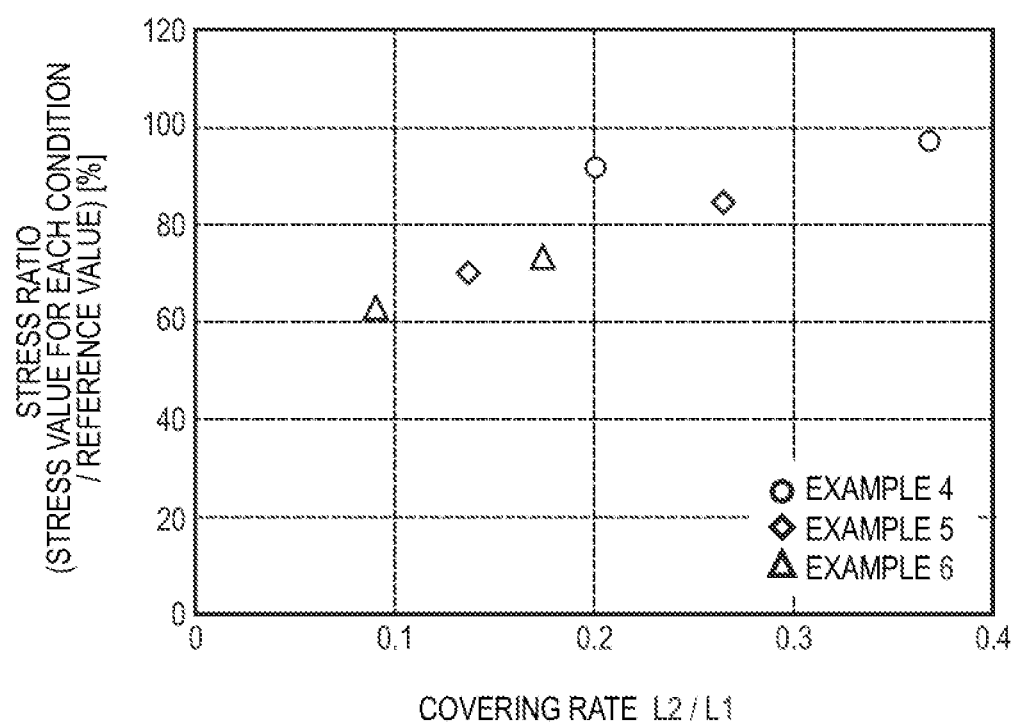
FIG. 17 is a graph illustrating a result of structure analysis of Examples 4, 5, and 6.

As illustrated in Table 1 below, the reinforcing effect when the length L1 and the covering length L2 were changed was inspected by structure analysis. The units of the length L1 and the covering length L2 in Table 1 are millimeter (mm), respectively. In addition, Table 1 indicates a covering rate L2/L1 that is a ratio of the covering length L2 to the length L1. The structure analysis scheme and the evaluation criterion are the same as in the conditions described previously. Further, in comparison of stress values, the stress value when the reinforcement member 21 is not arranged in Examples 4, 5, and 6 is defined as 100% of the reference value. FIG. 17 illustrates the result. As a result of the structure analysis under such conditions, a reinforcing effect was obtained regardless of the value of the covering rate L2/L1, and a particularly notable reinforcing effect was obtained when the covering rate L2/L1 is less than 0.4.

TABLE 1

|  | L1 (mm) | L2 (mm) | L2/L1 |
|---|---|---|---|
| EXAMPLE 4 | 0.9 | 0.18 | 0.20 |
|  |  | 0.33 | 0.37 |
| EXAMPLE 5 | 3.9 | 0.53 | 0.14 |
|  |  | 1.03 | 0.26 |
| EXAMPLE 6 | 5.9 | 0.55 | 0.09 |
|  |  | 1.09 | 0.18 |

As described above, it was confirmed that, according to the present invention, it is possible to reduce a load occurring in the connection portion 19 between the flexible wiring substrate 4 and the printed wiring board 9 without losing flexibility of the flexible wiring substrate 4.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-070655, filed Apr. 9, 2020, and Japanese Patent Application No. 2021-033766, filed Mar. 3, 2021, which are hereby incorporated by reference herein in their entirety.

What is claimed is:
1. An image pickup unit comprising:
a printed wiring board provided with an image pickup element and having a first electrode on a primary face of the printed wiring board;

a flexible wiring substrate having a base member having a first face and a second face, a conductive layer provided on the base member on a side of the first face, and an insulating layer provided on the conductive layer, wherein the conductive layer has a first region between the base member and the insulating layer, and the conductive layer further has a second electrode which is not provided between the base member and the insulating layer;

a conductive connection member that connects the first electrode to the second electrode, the conductive connection member contacts a second region of the second electrode; and a reinforcement member provided on the base member on a side of the second face, wherein the reinforcement member continuously covers a first portion of the flexible wiring substrate and a second portion of the flexible wiring substrate, the first portion including the second region of the second electrode, and the second portion including the first region of the conductive layer, wherein the second portion is arranged above the primary face of the printed wiring board, and the second portion is bent to a direction away from the printed wiring board with respect to the first portion.

2. The image pickup unit according to claim 1, wherein a bending angle of the second portion relative to the first portion is an obtuse angle.

3. The image pickup unit according to claim 1, wherein the second electrode is exposed between an end part of the insulating layer on a side closer to the second electrode and the conductive connection member.

4. The image pickup unit according to claim 1, wherein the reinforcement member is provided on both ends of the base member in a shorter direction of the flexible wiring substrate.

5. The image pickup unit according to claim 1, wherein the reinforcement member is provided so as to protrude from a part on the base member to a part on the printed wiring board in a longitudinal direction of the flexible wiring substrate.

6. The image pickup unit according to claim 1, wherein the reinforcement member is provided so as to protrude from a part on the base member to a part on the printed wiring board in a shorter direction of the flexible wiring substrate.

7. The image pickup unit according to claim 1, wherein a ratio of a length of a portion included in the reinforcement member and covering the insulating layer relative to a length in a longitudinal direction of the insulating layer is less than 0.4.

8. The image pickup unit according to claim 1 further comprising:

an imaging sensor module having the printed wiring board; and an image stabilizing unit that supports the imaging sensor module in a movable manner.

9. The image pickup unit according to claim 1, wherein the flexible wiring substrate extends from a connection portion in a second direction and is bent in a first direction, wherein the first electrode and the second electrode are connected by the conductive connection member in the connection portion, and the second direction is opposite to the first direction on a side of a connecting component to which the other longitudinal end part is connected.

10. The image pickup unit according to claim 1, wherein the reinforcement member is an epoxy resin and/or a cured material of an ultraviolet curable resin or a thermosetting resin.

11. The image pickup unit according to claim 1, wherein the reinforcement member is a film.

12. An imaging apparatus comprising a casing and an image pickup unit inside the casing, wherein the image pickup unit is the image pickup unit according to claim 1.

13. The imaging apparatus according to claim 12, wherein the imaging apparatus is a camera.

14. The image pickup unit according to claim 1, wherein the reinforcement member covers an end part of the insulating layer on a side closer to the second electrode and an end part of the conductive connection member on a side closer to the insulating layer.

15. The image pickup unit according to claim 1, wherein the reinforcement member is a resin in contact with the base member.

16. The image pickup unit according to claim 1, wherein the reinforcement member is in contact with the conductive connection member.

17. The image pickup unit according to claim 1, wherein the conductive connection member is a solder.

18. The image pickup unit according to claim 1, wherein the printed wiring board has a solder resist layer on the primary face of the printed wiring board, and the reinforcement member is in contact with the solder resist layer.

19. The image pickup unit according to claim 1, wherein the first portion of the flexible wiring substrate is arranged between a third portion of the flexible wiring substrate and the primary face of the printed wiring board.

20. The image pickup unit according to claim 1, wherein the third portion includes the first region of the conductive layer, and the third portion is not arranged between the reinforcement member and the primary face of the printed wiring board.

* * * * *

UNITED STATES PATENT AND TRADEMARK OFFICE
CERTIFICATE OF CORRECTION

| | |
|---|---|
| PATENT NO. | : 11,895,793 B2 |
| APPLICATION NO. | : 17/220606 |
| DATED | : February 6, 2024 |
| INVENTOR(S) | : Koji Noguchi, Yuya Okada and Mitsutoshi Hasegawa |

It is certified that error appears in the above-identified patent and that said Letters Patent is hereby corrected as shown below:

On the Title Page

Item (73), Column 1, In the Assignee:
"CANON KABU SHIKI KAISHA, Tokyo(JP)" should read --CANON KABUSHIKI KAISHA, Tokyo(JP)--

Signed and Sealed this
Twenty-sixth Day of March, 2024

Katherine Kelly Vidal
*Director of the United States Patent and Trademark Office*